US008004432B2

(12) United States Patent
Kawato

(10) Patent No.: US 8,004,432 B2
(45) Date of Patent: Aug. 23, 2011

(54) TIME-OF-FLIGHT MEASURING DEVICE

(75) Inventor: Eizo Kawato, Kizugawa (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 12/745,468

(22) PCT Filed: Nov. 30, 2007

(86) PCT No.: PCT/JP2007/073179

§ 371 (c)(1),
(2), (4) Date: Aug. 6, 2010

(87) PCT Pub. No.: WO2009/069225

PCT Pub. Date: Jun. 4, 2009

(65) Prior Publication Data

US 2010/0309031 A1 Dec. 9, 2010

(51) Int. Cl.
*H03M 7/30* (2006.01)

(52) U.S. Cl. .............. 341/87; 341/65; 341/67; 250/282; 250/287

(58) Field of Classification Search .................... 341/50, 341/58, 87
See application file for complete search history.

(56) References Cited

U.S. PATENT DOCUMENTS 4,626,829 A * 12/1986 Hauck ............................ 341/63
5,367,162 A * 11/1994 Holland et al. ............... 250/287
6,627,877 B1 * 9/2003 Davis et al. ................... 250/287
6,737,642 B2 5/2004 Syage et al.
6,765,199 B2 * 7/2004 Youngquist et al. .......... 250/287
6,940,066 B2 * 9/2005 Makarov et al. .............. 250/287
7,084,393 B2 * 8/2006 Fuhrer et al. .................. 250/283
2006/0248942 A1 11/2006 Oonishi et al.

FOREIGN PATENT DOCUMENTS

JP 2000-299083 A 10/2000
JP 2002-511211 A 4/2002
JP 2003-216190 A 7/2003
JP 2006-236795 A 9/2006
WO 98/54847 A1 12/1998
WO 03/042979 A2 5/2003

OTHER PUBLICATIONS

Koichi Tanaka, "Matorikkusu Shien Rehzah Datsun Ionka Shitsuryou Bunsekihou (Matrix Assisted Laser Desorption/Ionization Mass Spectrometry)", Bunseki, (1996), pp. 253-261, vol. 4.
Benjamin M. Chien, et al., "The design and performance of an ion trap storage-reflectron time-of-flight mass spectrometer", International Journal of Mass Spectrometry and Ion Processes, (1994), pp. 149-179, vol. 131.

* cited by examiner

*Primary Examiner* — Khai M Nguyen
(74) *Attorney, Agent, or Firm* — Sughrue Mion, PLLC

(57) ABSTRACT

A time-of-flight measuring device for performing a hardware-based high-speed data compression process before transferring the data from a signal recorder to a data processor is provided. A time-series digital signal recorded by a signal recorder is converted to a plurality of time-series digital signals by being divided into a bit string including baseline information and a bit string not including the baseline information. Then, the time-series digital signal consisting of a bit string not including the baseline information is compressed by run-length encoding, such as zero length encoding or switched run-length encoding. Subsequently, static Huffman coding is performed on each of the time-series digital signals to reduce the data amount.

10 Claims, 6 Drawing Sheets

TIME-OF-FLIGHT MEASURING DEVICE

CROSS REFERENCE TO RELATED APPLICATIONS

This application is a National Stage of International Application No. PCT/JP2007/073179 filed Nov. 30, 2007, the content of which is incorporated herein by reference in its entirety.

TECHNICAL FIELD

The present invention relates to a time-of-flight measuring device having a signal recorder for recording a detection signal produced by a detector and for transferring data to a data processor.

BACKGROUND ART

The time-of-flight measuring device is a device for determining the energy of an ion or electron by measuring the time of flight of the charged particle. One variation of this device is an analyzing device called the time-of-flight mass spectrometer. In this device, an ion generated by an ion generator is accelerated to a specific speed and released into a flight space having a specific distance. Within this space, the ion is guided to fly to an ion detector, which produces a signal upon receiving the ion. The period of time from the release of the ion to its detection is measured and recorded by an ion signal recorder, and the mass of the ion is determined based on this information. For example, Non-Patent Document 1 discloses a "matrix-assisted laser desorption/ionization time-of-flight mass spectrometer (MALDI-TOFMS)", which perform a mass analysis by accelerating an ion generated by laser irradiation and measuring the time of flight required for this ion to reach the detector. For another example, Non-Patent Document 2 discloses an "ion trap time-of-flight mass spectrometer (IT-TOFMS)", which performs a mass analysis by accelerating an ion stored in an ion trap and measuring the time of flight required for this ion to reach the detector. There are also many other types of time-of-flight mass spectrometers, such as a time-of-flight secondary ion mass spectrometer in which a device for generating a secondary ion by an ion beam is used as an ion generator.

In an ion signal recorder of a time-of-flight measuring device, the signal intensities of ions arriving at an ion detector are converted into digital values by an analogue-to-digital converter (ADC) and recorded in the form of time-series digital signals. The principle of this device is the same as that of the digital storage oscilloscope (DSO). In recent years, the advancement of the digital data processing has increased the speed of analogue-to-digital conversion, so that the ion signals can be recorded at higher sampling frequencies. This contributes to improving the mass resolution.

Although it depends on the mass range and the apparatus size, many time-of-flight mass spectrometers are designed to measure flight times within a range from a few us to several tens of μs. When a mass resolution of 10000 is required, it is necessary to measure the time of flight with an accuracy of one-20000$^{th}$ of the time of flight. This means that the time of flight needs to be calculated with an accuracy of approximately 1 ns. Therefore, the ADC of the ion signal recorder must be capable of operating at a sampling frequency of 1 GHz or higher.

With recent DSO techniques, it is relatively easy to operate ADCs at such high frequencies. However, for example, if the sampling frequency is raised from 1 GHz to 2 GHz, the amount of data obtained for the same time-of-flight range will be doubled. If the measurement range of the time of flight is 100 μs, the amount of data resulting from one measurement will increase from 100000 to 200000. Raising the frequency to 4 GHz will make the data amount to be further doubled. These data are not only recorded in a data processor (such as a computer) but also used in various operations, such as an integration or a time-to-mass conversion for real-time graphical display. Therefore, it is impractical to infinitely raise the sampling frequency; the sampling frequency needs to be selected so that the amount of data will be appropriately reduced according to the data-processing speed.

Increasing the amount of the data transferred from the ion signal recorder to the data processor requires a faster communication means. Furthermore, it also requires a larger capacity of data storage devices, such as hard disk drives (HDD), for storing data in the data processor. As a result of these reasons, for a time-of-flight mass spectrometer using a normal ADC, a sampling frequency of approximately 1 GHz is selected for the ADC used in the ion signal recorder.

On the other hand, there is an ever-increasing demand for higher levels of mass accuracy. In the measurement of the mass of high-molecular-weight samples, such as DNA or peptides (i.e. the constituents of proteins), the mass measurement accuracy is key to obtaining successful results in the analysis of their molecular structure. If a mass measurement accuracy of 10 ppm is required, it is necessary to measure the time of flight with an accuracy of 5 ppm. For example, for an ion having a flight time of 40 μs, the allowable measurement accuracy of the time of flight is 200 ps.

When an ADC is operated at a sampling frequency of 1 GHz, the digital-conversion interval is 1 ns. Measuring an ion signal at this sampling frequency makes a signal peak like a polygonal line, as shown in FIG. 6. By performing a calculation using these data points, the position of the center of the peak is determined. For example, this is achieved by calculating the center of gravity of the data points with each point weighted by its signal intensity. This mathematical operation makes it possible to measure the time of flight more accurately than the digital-conversion interval. However, further enhancing the analysis accuracy requires even higher sampling frequencies.

A major reason for the difficulty in increasing the sampling frequency is the increase in the data amount. In the previous example, using a sampling frequency of 4 GHz would result in a data amount of 400,000 measurement points for each mass spectrum. One mass spectrum is normally obtained by integrating the results of two or more measurements, and the data length of each measurement point is approximately 16 bits (2 bytes) if an 8 or 10-bit ADC is used. Therefore, the data amount of one mass spectrum will be 800,000 bytes. Given that ten mass spectrums should be obtained per one second and the transfer of the obtained data occupies one tenth of the communication channel, the data transfer rate will come to 80 megabytes per second. Although this level of data transfer rate can be achieved by using a gigabit Ethernet®, it will increase the load on the data processor and particularly cause a heavy load on the real-time data processing. Furthermore, continuing the measurement produces 28.8 gigabytes of data for every one hour, which can easily exhaust the hard-disk capacity. To prevent this situation, it is necessary to frequently transfer the data to external record media, such as digital versatile disks (DVDs), which further increases the load on the data processor. In summary, the attempt to improve the analysis performance by simply raising the sampling frequency will produce an extremely large amount of data that cannot be handled at the processing speed of the entire system.

In a conventional time-of-flight mass spectrometer disclosed in Patent Document 1, the increase in the data amount is prevented in such a manner that any data value having a signal intensity equal to or less than a specific threshold level is replaced with a baseline value if the data value is within a portion of the mass spectrum other than the mass peaks. Another method includes deleting any data value having a signal intensity equal to or less than the specific threshold level. By such processes of reducing the amount of data while maintaining the data of the mass-peak portions, it is possible to significantly reduce the amount of data, which can be compressed to one hundredth of the original data for some patterns of mass peaks. However, once these processes are completed, it is impossible to find minor mass peaks obscured by the noise even if an attempt is made to improve the signal-to-noise (S/N) ratio by integrating a plurality of mass spectrums in a post-processing or other stages. For the integration or other statistical operation to be effective in locating minor mass peaks having a signal intensity approximate to the background level, it is necessary to record all the data without deleting the background-level data whose signal intensity is equal to or lower than the threshold level.

Non-Patent Document 1: Koichi Tanaka, "Matorikkusu Shien Rehzah Datsuri Ionka Shitsuryou Bunsekihou (Matrix Assisted Laser Desorption/Ionization Mass Spectrometry)", *Bunseki,* 4, pp. 253-261 (1996)

Non-Patent Document 2: Benjamin M. Chien, Steven M. Michael and David M. Lubman, "The design and performance of an ion trap storage-reflectron time-of-flight mass spectrometer", International Journal of Mass Spectrometry and Ion Processes, 131, pp. 149-179 (1994)

Patent Document 1: U.S. Pat. No. 6,737,642

DISCLOSURE OF THE INVENTION

Problem to be Solved by the Invention

As already explained, in the conventional time-of-flight mass spectrometer, an attempt to improve the analysis performance by raising the sampling frequency produces an extremely large amount of data that cannot be handled at the processing speed of the entire system. However, deleting the background-level data causes the loss of information relating to minor mass peaks and thereby eliminates the possibility of improving the S/N ratio by integration or other processes.

Therefore, it is necessary to apply a reversible compression process to reduce the amount of data with no loss of information. This process is normally performed by a data processor and requires a large memory area and sufficiently long computation time to achieve a data compression ratio suitable for practical use. Nevertheless, the effort of reducing the data amount by the data compression process may rather increase the load on the data processor if the data compression process requires a significant computation time.

Accordingly, it is desirable to reduce the processing load on the data processor by providing a hardware device for applying a reversible compression process on data to compress the data and reduce its amount before it is fed to the data processor.

The present invention has been achieved to solve the aforementioned problem, and its objective is to provide a time-of-flight measuring device for performing a hardware-based high-speed data compression process before transferring the data from a signal recorder to a data processor.

Means for Solving the Problems

To solve the aforementioned problem, a time-of-flight measuring device according to the present invention is characterized in that a signal recorder is provided, the signal recorder records a detection signal as a time-series digital signal, the digital signal is converted into a plurality of time-series digital signals by being divided into a bit string including baseline information and one or more bit strings not including the baseline information, the aforementioned one or more bit strings not including the baseline information undergo run-length encoding, and subsequently static Huffman coding is performed on each of the plurality of time-series digital signals resulting from the division.

In one mode of the present invention, the device is further characterized in that the aforementioned run-length encoding is zero length encoding (ZRE) or switched run-length encoding (SRLE).

The data compression process according to the present invention is hereinafter described.

When a measurement of the time-of-flight is initiated, an ion detection signal begins to be inputted to an ion signal recorder. Then, this signal is converted to a digital signal by one ADC or a set of ADCs. This digital signal, which is generated at specific sampling intervals, is stored in an internal memory of the ion signal recorder to form a time-series digital signal (S101). The digital signal may include an information bit representing an over-range flag of the ADC(s) or other kinds of information in addition to the amplitude information of the original analogue signal. Although the data length used in this device is normally equal or approximate to 16 bits, it should be appropriately chosen according to the bit length used in analogue conversion and, in the case where an integrating operation is performed by the ion signal recorder, the count of integration.

Many of the inputted time-series digital signals have data values around the offset value of the ADC. This is due to the fact that, when there is no pulse-shaped input such as a mass peak, the output value of the ADC randomly fluctuates within a limited range around the offset value due to the noise of an input amplifier of the ADC or other components. Accordingly, the data values are individually divided into a plurality of bit strings so that the bits that frequently change due to the fluctuation of the data values will be gathered together (S102). (These bits are called the "baseline information" in this specification.) The dividing pattern depends on the format of the digital signal. For example, binary data can be divided into high-order 8 bits and low-order 8 bits since the aforementioned random change occurs only in their low-order bits. Each bit string resulting from this division should have an appropriate bit length that can be efficiently compressed by a hardware device. For field programmable gate arrays (FPGAs) used in recent years, an appropriate bit length is 10 bits or less. Future progresses in the integrated-circuit technology will allow the use of longer bit lengths. If the original digital signal has a data length of 24 bits to increase the count of integration by the ion signal recorder, it is possible to divide the signal into three bit strings each having a length of 8 bits. It is not always necessary to equalize the length of the bit strings resulting from the division. Furthermore, for example, if the data length of the original digital signal can vary according to the count of integration, the length of the bit strings obtained by the division may be accordingly changed.

Each of the time-series digital signals resulting from the division is individually subjected to a compression process. Specifically, the time-series digital signal consisting of a bit string including baseline information (i.e. the bits that frequently change according to the fluctuation of the data value) undergoes static Huffman coding (S103). On the other hand, the time-series digital signal consisting of a bit string not including the baseline information undergoes run-length encoding (RLE) (S104), after which the static Huffman coding follows (S105).

The time-series digital signals that have been individually compressed are then transferred to the data processor (S106). This can be achieved by either separately transferring each piece of data of the individually compressed time-series digital signals or collectively transferring all the data in the form of a single file.

The principle of the present invention is hereinafter described. The data compression method can be classified into two categories: one is the non-reversible compression, which is often used for compressing image data or other purposes; the other is the so-called reversible compression, which allows the restoration of the original state at a later time and is often applied to programs or data. There are various reversible compression methods, such as an entropy encoding, which uses a system of codes assigned according to the information entropy, and a dictionary-based coding, which uses a system of codes assigned according the regularity in the occurrence of data. The latter method is often applied to character data. To increase the compression efficiency, it is necessary to combine appropriate methods according to the regularities or other characteristics of the data to be compressed. Taking this into account, the characteristics of the data recorded by the ion signal recorder of the time-of-flight mass spectrometer are hereinafter described.

The ion signal recorder includes one or more ADCs, which convert analogue signals into digital signals at a predetermined sampling frequency. The digital signals basically represent signal intensities by an integer, although its representation form depends on the positive/negative polarity or the coding method used in the designing of electric circuits (e.g. gray code).

FIG. 2 shows an example of the mass spectrum, in which a set of measured signal intensities are displayed in order of measurement. The scale of the horizontal axis indicates the m/z value (the mass divided by the atomic mass unit and the absolute value of the charge number) converted from the measurement time. The vertical axis shows the value obtained by subtracting 3 (i.e. an offset value) from the integer value of each data. In the data shown in this figure, the actual baseline value is slightly greater than 3, so that the signal intensity within the mass ranges with no mass peak after the subtraction of the offset value has a value of 0 or 1 due to the random noise, and occasionally −1. As in this example, the data handled by time-of-flight mass spectrometers are characterized in that their values are normally close to the baseline during the measurement period and occasionally take a significantly different value when a pulsed signal corresponding to a measurement target is detected.

FIG. 3 shows a portion of the same mass spectrum covering an m/z range from 330 to 345 where prominent mass peaks are located, and FIG. 4 shows a mass spectrum obtained by integrating 1000 pieces of mass spectrums like the one shown in FIG. 3. The integrating operation has reduced the random noise relative to the signal intensities of the peaks and thereby improved the S/N ratio. FIG. 5 is a mass spectrum obtained by vertically stretching the spectrum shown in FIG. 4. As a result of the integrating operation, the peaks having average strengths equal to or less than 1 (or 1000 by the vertical scale in FIG. 5 since this spectrum includes 1000 pieces of integrated data) have become clearly recognizable.

The peak at m/z=340.0 in FIG. 3, which has an intensity of 4, can be recognized as a mass peak in FIG. 5, whereas the peak at m/z=338.5 in FIG. 3, which also has an intensity of 4, has not turned out to be a mass peak in FIG. 5. Thus, the integrating operation makes it possible to judge whether a given peak is a mass peak or not even if the peak has a signal intensity comparable to the random noise. To make this judgment, it is essential to record all the data values including those approximate to the random-noise level.

The following sequence of numbers is the original data values (before the subtraction of the offset value) within the range from m/z=332 to m/z=333:

3, 4, 4, 3, 4, 3, 3, 3, 3, 3, 3, 3, 4, 5, 3, 3, 3, 3, 3, 3, 4, 3, 3, 4, 3, 3, 2, 3, 4, 3, 3, 3, 3, 3, 3, 3, 3, 3, 3, 3, 3, 3, 3, 3, 3, 3, 6, 5, 3.

The data value 3 has the highest frequency, followed by the data value 4. The other members are the data value 5 occurring two times and the data values 6 and 2 each occurring one time. The data values of 2 to 6 can be expressed by 16-bit binary numbers as follows:

Data value 2=0000000000000010(binary)

Data value 3=0000000000000011(binary)

Data value 4=0000000000000100(binary)

Data value 5=0000000000000101(binary)

Data value 6=0000000000000110(binary)

As can be seen, the bit patterns of these data values change only in the low-order 3 bits. Thus, the time-series digital signals forming a mass spectrum has the characteristic that a majority of their data values conform to a specific bit pattern, with different bit patterns exceptionally occurring only at some points where mass peaks are located.

One of the simplest compression methods utilizing this characteristic, i.e. the frequent change of the bits in specific places, may be the extraction of only one bit of the data value and apply run-length encoding (RLE) to that bit. This method can achieve high compression ratios for high-order 13 bits but is nearly ineffective in compressing the low-order 3 bits. This is due to the fact that all the low-order 3 bits simultaneously change every time the data value changes from 3 to 4 or vice versa. Therefore, applying this method will result in an average bit length equal to or greater than 3 bits after the compression. Another problem is that increasing the count of integration increases the offset value and accordingly widens the fluctuation range of the data value, causing a rapid increase in the number of bits that cannot be effectively compressed.

In the mass spectrum shown in FIG. 2, calculating the amount of average information (entropy) of the data values within a range from m/z=200 to m/z=400 results in 0.89 bits. This suggests the possibility that an average bit length of approximately 1 bit after the compression can be achieved by an entropy encoding to assign a short code to the most frequent data value. By contrast, the dictionary encoding, which is normally applied to document files or similar data, has no significant effect since mass spectrums have no regularity in the occurrence pattern of their data values.

The entropy encoding has several variations, such as Huffman coding, arithmetic coding and range encoding. The arithmetic coding can achieve high compression ratios. However, it requires a long computation time and hence is not suitable for hardware-based high-speed compression. The Huffman coding can be categorized into adaptive Huffman coding, in which the code conversion proceeds while creating a Huffman tree necessary for the encoding, and static Huffman coding, in which the code conversion is performed after the occurrence frequency of the data values is computed beforehand to create a Huffman tree. For mass spectrums, the static Huffman coding is more suited since mass peaks can randomly occur at any points in the spectrum and there is no specific regularity in the occurrence pattern of the data values.

In the static Huffman coding, it is necessary to initially read all the data values and prepare a frequency table showing the frequency of each data value. If a program for this process is created on a computer or similar device, it is easy to ensure an internal memory area for a frequency table of 16-bit data values. However, it is difficult to ensure such a large memory area in an FPGA or similar hardware device. Furthermore, creating a Huffman tree from such a table also requires a large amount of memory and long processing time.

One effective solution to these problems is to divide the data values of the mass spectrum into bit strings having appropriate lengths and apply static Huffman coding to each bit string. The dividing process is performed in such a manner that the changeable portion of the frequently occurring data values will be collectively included in one bit string of the divided data. In the previous example, the data values from 2 to 6 frequently occur. Therefore, the low-order 3 bits should be included in one bit string resulting from the division.

Performing the integrating operation by a hardware device causes a shift of the frequently changing portion of the data value. In the case of the mass spectrum in the previous example, the offset value is approximately 3 and the standard deviation is 1.1. Under these conditions, if the integrating operation is performed 64 times, the baseline value increases to approximately 192, with a standard deviation of 8.8. In this situation, the data values of up to 255 frequently occur, which means that the low-order 8 bits of the bit string frequently change while the high-order 8 bits are all zero except when a mass peak appears. Taking this into account, each 16-bit data value is divided into high-order 8 bits and low-order 8 bits, a separate time-series digital signal is created from each of these two bit strings, and static Huffman coding is applied to each signal.

The position and/or length of the bit string resulting from the division may be changed according to the count of integration. For example, when the count of integration is one, the low-order 3 bits may constitute one bit string. When the count of integration is 64 and it is assumed that the most frequently occurring data values lie within a range of (baseline)±3×(standard deviation), i.e. from 166 to 218, it is possible to subtract 166 from each data value to pack the frequently occurring data values into a range from 0 to 52, which allows the low-order 6 bits to constitute one segment of the bit string. However, since these computations do not change the occurrence frequency of the data values, the average length of the codes after the application of the Huffman coding will not change, and the compression efficiency will not change, either; the only difference is that the number of 0s constituting the high-order bits of each bit-string segment increases when a correspondence table of the Huffman code and the original data values is transferred. Therefore, no significant effect can be expected even if the position or length of the bit string is changed according to the count of integration. What is necessary is to appropriately select the bit length of the bit string within a range that can be processed by hardware devices, such as FPGAs.

If the length of the time-series digital signal, i.e. the upper limit of the number of data values of the mass spectrum, is one million, the upper limit of the value of each member in the frequency table is one million and can be represented by 20 bits. Additionally, if each bit string resulting from the division has a length of 10 bits, the frequency table has 1024 members. Under these conditions, the table can be realized with a 20-Kbit memory. The amount of memory required for the Huffman coding is no greater than several times of this value. Therefore, it is possible to realize the table with an FPGA or similar hardware device if the bit length is 10 bits or less. Using a bit length greater than 10 bits would require an external memory device in addition to the FPGA, which lowers the compression rate due to the additional time required for accessing the external memory.

The foregoing discussion assumes that the data values have a length of 16 bits. However, actually used ion signal recorders may add an over-range bit, which indicates whether an analogue signal fed to the ADC exceeds the ADC's conversion range, or use a larger number of bits to allow for a larger repetition count of integration. Even in such cases, the data value can be appropriately divided so that one bit string includes all the bits that are changed by the frequently occurring data values (i.e. the baseline information) while the other bit string consists of the other bits within a range supported by a hardware device.

In summary, the amount of data derived from a time-series digital signal recorded by an ion signal recorder is reduced by dividing the time-series digital signal into a bit string including baseline information and one or more bit strings not including the baseline information, and by applying static Huffman coding to each of the time-series digital signals resulting from the division.

As a matter of course, when the compressed data is transferred to the data processor, other information is added to it, such as the data length, the information relating to the Huffman tree to be used for decoding the compressed data, and the original data values corresponding to the compression codes.

As described to this point, dividing the data values makes it possible to efficiently compress the data with hardware devices. However, in the time-series digital signal composed of bit strings not including baseline information, most of the bit strings are such that composed of all "0" bits, and will be converted to a 1-bit code. Such a time-series digital signal has an average information (entropy) of nearly zero and can be further compressed. As in this case, if bit strings each consisting of all "0" bits repeatedly appear in series, the run-length encoding (RLE) is effective. That is to say, it is preferable to previously use the run-length encoding to compress the time-series digital signal composed of the bit string not including baseline information resulting from the division, and subsequently apply the static Huffman coding to the compressed data.

One well-known variation of the run-length encoding is PackBits, a method that is used in TIFF (Tagged Image File Format) files. However, this method requires inserting a length-indicating code for every 127 pieces of continuous values (in the case of 8 bits); the zero length encoding (ZRE) and switched run-length encoding (SRLE) are more appropriate for compressing mass spectrums.

The zero length encoding is a technique including the steps of counting the number of bit strings with all the bits being "0" and representing the bit strings by two codes. To simplify the notation, the following explanation assumes that the bit string has a length of 8 bits, and denotes each 8-bit string by the decimal notation of its value enclosed by single quotation marks. For example, the bit string of 00000000(binary) will be represented as '0', and 11111111(binary) as '255.' In the encoding process, the number of continuously occurring '0', i.e. the digit to be compressed, is initially counted. This number is hereinafter denoted by N. Next, the value of N+1 is represented in binary notation, and all the bits exclusive of the first bit 1 are each denoted by using the code '0' for a bit value of 0 and the code '1 ' for a bit value of 1. For example, if N is 5, then N+1 is 6, or 110 in binary notation. Ignoring the first bit 1, a code string of '1', '0 ' is assigned to the remaining bits 1 and 0. For another example, if N is 11, N+1 is 12, or 1100 in binary notation. Ignoring the first bit 1, a code string of '1', '0 ', '0 ' is assigned to the remaining bits 100. Thus, unlike PackBits or similar methods, the present method uses a plurality of codes to indicate the length. However, if the data includes the same value continuously occurring over a significant length, the present method can achieve higher compression ratios since there is no need to insert the length-indicating code for every 127 bits (in the case of 8 bits). It should be noted that the use of two codes '0 ' and '1 ' for representing the length of continuation of the data value '0 ' requires corresponding changes of the other data. A generally used method is as follows: The data values from '1 ' to '253 ' are respectively converted to the codes '2 ' and '254 ' by adding 1 to each data value. The data value '254 ' is converted to a code string of '255', '0 ', and '255 ' is converted to '255', '1 '. According to this method, the codes '0 ' and '1 ' subsequent to '255 ' are not a portion of the code string indicating the length of continuation of a data value '0 ' but a suffix for identifying '254 ' and '255 ', while the codes '0 ' and '1 ' occurring at the other positions should be interpreted as a code string indicating the length of continuation of a data value '0 '. If the data continuation occurs many times, the codes '0 ' and '1 ' will frequently occur. These codes will be replaced with small-bit codes in the Huffman coding, whereby the compression ratio is further improved.

In the switched run-length encoding, on the assumption that a sequence consisting of different data values and a sequence consisting of the same data repeatedly occur, a code indicating the length of the sequence is inserted immediately before each sequence consisting of different data values, while each sequence consisting of the same data value is converted to a code indicating the length of the sequence. If a sequence consists of 255 or more data values (in the case of 8 bits), the code '255 ' is inserted and the remaining data values are similarly encoded. Thus, unlike PackBits, which generates a code and data value for every 127 data values, the switched run-length encoding generates only the length-indicating code for every 255 data values, so that the compression ratio is improved. The compression ratio is further improved by the Huffman coding, in which '255 ' is converted to a code having an even smaller bit length.

In most cases, the zero length encoding surpasses the switched run-length encoding in terms of the compression ratio after the completion of the subsequent Huffman coding, although both techniques can achieve adequately high compression ratios and make no significant difference for practical use.

The previous description assumed the use of an ADC in the signal recorder. Alternatively, it is possible to use a time-to-digital converter (TDC). The system using a TDC is not as efficient as the one using an ADC yet can effectively work as a compression means if the data include a large amount of background information.

EFFECT OF THE INVENTION

The time-of-flight measuring device according to the present invention can compress data at high speeds by means of a hardware device in a signal recorder. This shortens the period of time for transferring data to a data processor, such as a computer, and improves the processing performance of the device. Compressing the data also decreases the amount of use of an external storage device, such as a hard disk, and thereby reduces the frequency of creating backup data on a DVD or other media. The signal recorder can be operated at higher sampling frequency to record signals, whereby the resolution can be enhanced to improve the device performance. In the case of a time-of-flight mass spectrometer, its mass-resolving power will be improved.

EXPLANATION OF NUMERALS

1 . . . High Performance Liquid Chromatograph
2 . . . Ion-Introducing Optical System
3 . . . Time-of-Flight Analyzer
4 . . . Ion Trap Power Source
5 . . . Ion Signal Recorder
6 . . . Data Processor
7 . . . Control Circuit
11 . . . Ring Electrode
12, 13 . . . End Cap Electrode
14 . . . Flight Space
15 . . . Ion Reflector
16 . . . Ion Detector
17 . . . Ion Generator
21 . . . Ion-Capturing Space

BEST MODE FOR CARRYING OUT THE INVENTION

As one example of the time-of-flight measuring device according to the present invention, a time-of-flight mass spectrometer is hereinafter described.

Figure 7:
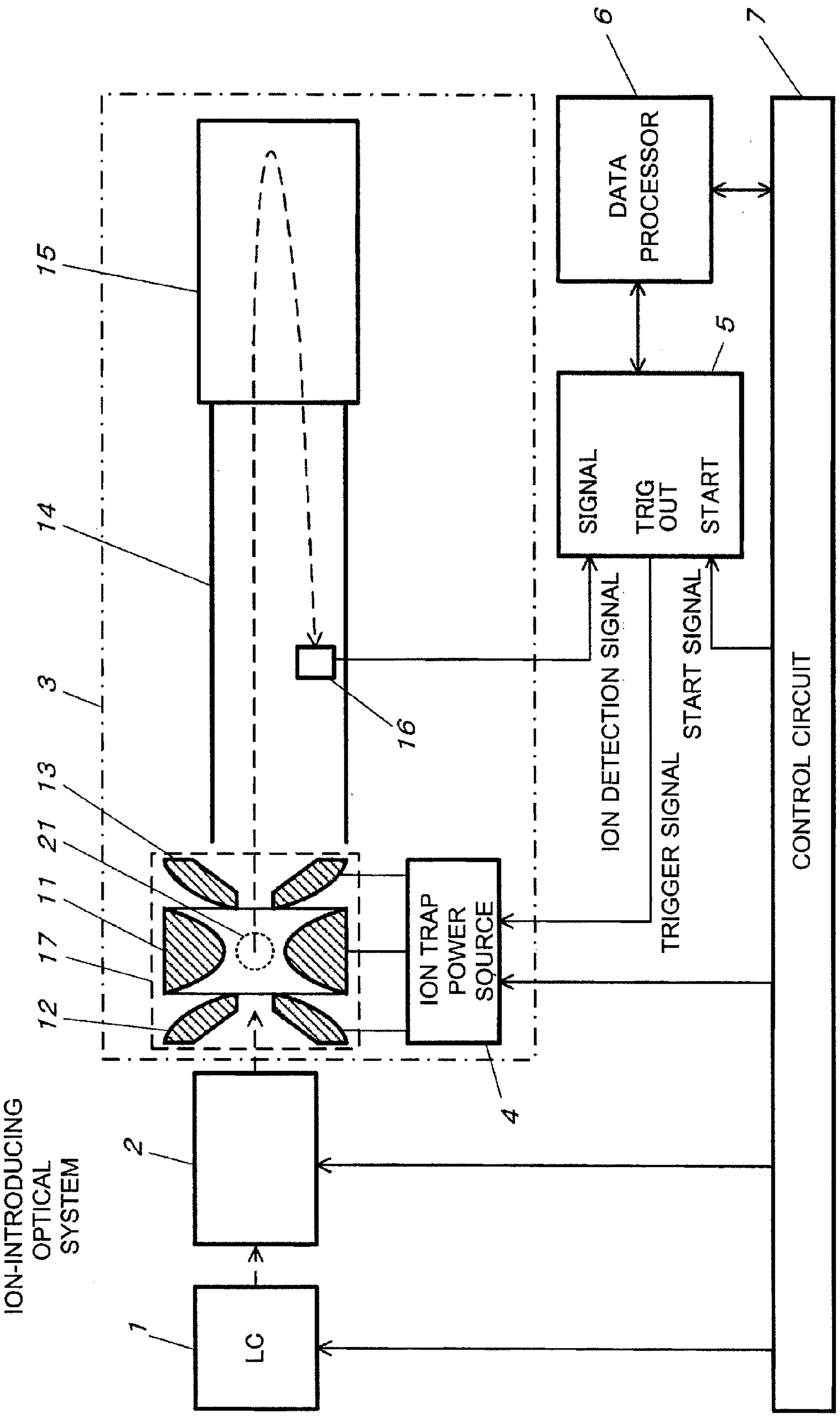
FIG. 7 is a configuration diagram of the main components of a high performance liquid chromatograph ion trap time-of-flight mass spectrometer (LC-IT-TOFMS) which is one embodiment of the present invention.

FIG. 7 is a configuration diagram showing the main components of a high performance liquid chromatograph ion trap time-of-flight mass spectrometer (LC-IT-TOFMS) using a high performance liquid chromatograph (LC) as a preprocessor for mass analysis. A liquid sample is injected into the LC 1 and exits the LC 1 at different points in time due to the properties of its components.

The liquid sample that serially exits the LC 1 with the elapse of time is subsequently ionized by an ion-introducing optical system 2 and introduced into a vacuum. The ion-introducing optical system 2 includes an ionization probe and an ion guide.

For example, the ionization is performed by using an electrospray ionization probe or atmospheric pressure chemical ionization probe (both not shown), which produces ions by atomizing the liquid sample into droplets, vaporizing the solvent from the droplets and giving them electric charges. These ions are transferred through differentially evacuated chambers to the ion guide in a vacuum, where the ions are retained in a condensed state by a multi-pole electric field. Then, at an appropriate timing, the stored ions are sent to an ion generator 17, which is a component of a time-of-flight analyzer 3.

The time-of-flight analyzer 3 consists of the ion generator 17, a flight space 14, an ion reflector 15 and an ion detector 16.

The ion generator 17 is an ion trap, which includes a ring electrode 11 and a pair of end cap electrodes 12 and 13 facing each other. A radio-frequency high voltage is applied to the ring electrode 11. This voltage, in conjunction with a quadrupole electric field created within the space between the two end cap electrodes 12 and 13, forms an ion-capturing space 21, in which ions will be captured. Within this ion trap, the selection and dissociation of the ions are performed as a preliminary analysis before the time-of-flight measurement. The electrodes 11, 12 and 13 of the ion trap are each connected to an ion trap power source 4, which applies appropriate voltages according to the analysis steps. Upon receiving a trigger signal from an ion signal recorder 5 (TRIG OUT), the ion trap power source 4 applies specific voltages to the ion trap so as to accelerate the ions captured in the ion-capturing space 21 and eject them into the flight space 14, thus making the ion trap function as an ion generator of the time-of-flight analyzer 3. For example, in the case of the measurement of positive ions, the power source sets the voltage of the ring electrode 11 to 0V, that of the end cap electrode 12 to +3760V and that of the end cap electrode 13 to −7000V as soon as it receives the trigger signal. This voltage setting accelerates the positive ions toward the flight space 14 and introduces them into the space.

The flight space 14 is maintained at the same voltage as applied to the end cap electrode 13 in the ion acceleration phase, e.g. −7000V in the case of the measurement of positive ions. Within this space, the ions fly at constant speeds since there is no electric field acting on them.

Located at the end of the flight space 14 is an ion reflector 15 for reflecting the ions introduced from the ion generator 17. An appropriate voltage is applied to this reflector so as to correct the variation in the initial position or energy of the ions inside the ion generator 17. The ions that have entered the ion reflector 15 are decelerated by an internal electric field of the ion reflector 15 and then re-accelerated toward the ion detector 16. After being reflected by the ion reflector 15 in this manner, the ions fly once more through the flight space 14 at constant speeds and eventually reach the ion detector 16.

The ion detector 16 includes a micro channel plate (MCP) and generates analogue signal pulses having an amplitude proportional to the number of ions that have reached the detector.

In addition, another power source (which is not shown) is connected to the flight space 14, ion reflector 15 and ion detector 16 to apply appropriate voltages according to the polarity of the ion and other factors.

The analogue signals generated from the ion detector 16 are sent, as ion detection signals, to the signal input terminal (SIGNAL) of the ion signal recorder 5. Upon receiving a start signal (START), the ion signal recorder 5 initiates the measurement; it performs the A/D-conversion of the ion detection signals at intervals of 1 ns in synchronization with the 1 GHz sampling clock and records the resultant signals as the time-series digital signals.

Figure 1:
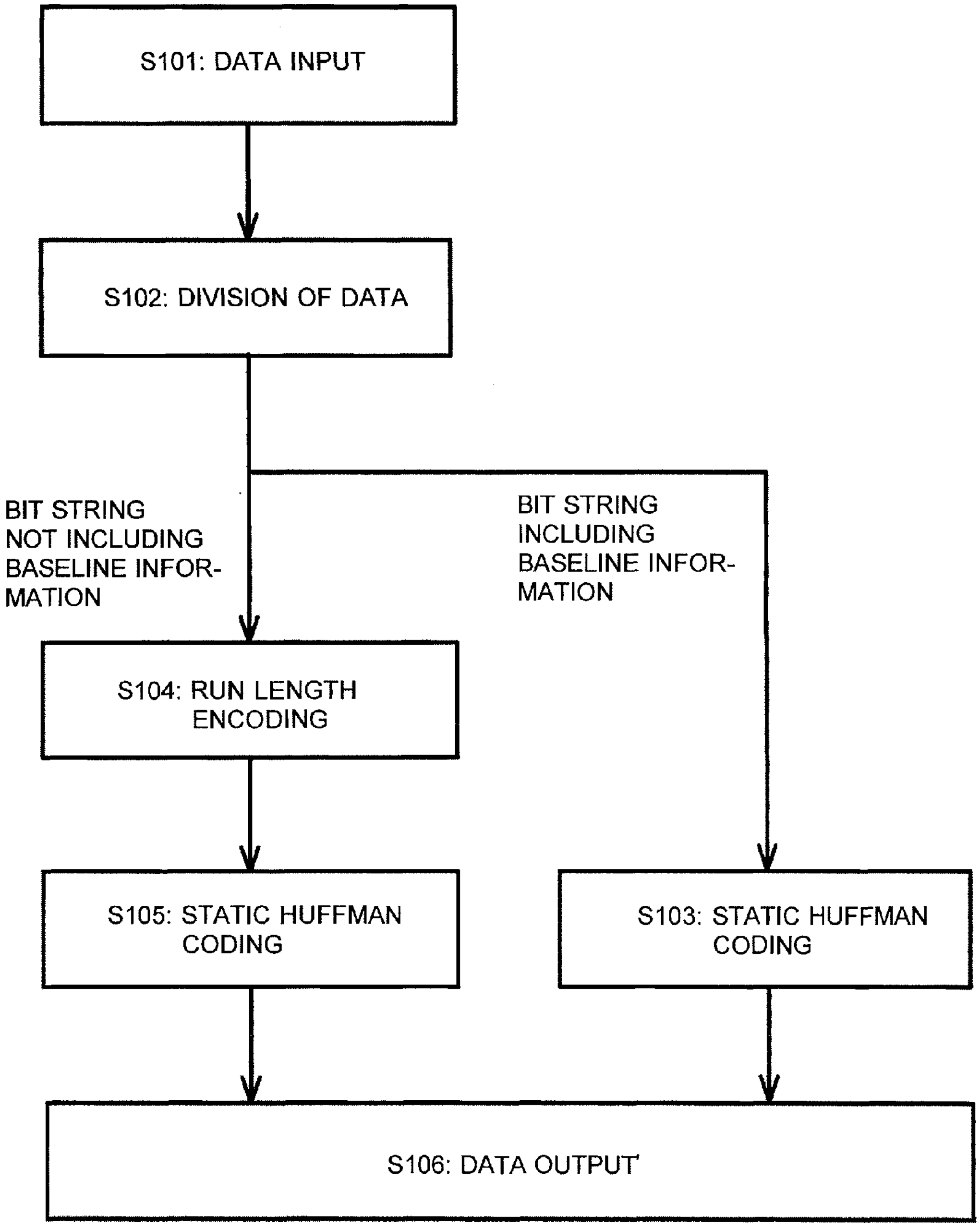
FIG. 1 shows the steps of compressing time-of-flight data according to the present invention.

The data collected by the ion signal recorder 5 are compressed according to the steps shown in FIG. 1. The compressed data are sent to a data processor 6 (e.g. a computer) at an appropriate timing, to be used in various processes, such as displaying the data with the horizontal axis converted to mass or calculating the peak positions. For each phase of the analysis, a control circuit 7 appropriately controls the voltage applied to each of the aforementioned components and the timing of the voltage application.

Compressing the data obtained from the time-series digital signals collected by the ion signal recorder 5 reduces the time required to transfer the data to the data processor 6, so that the subsequent task can be immediately initiated. It also lessens the load required to record the data.

Figure 2:
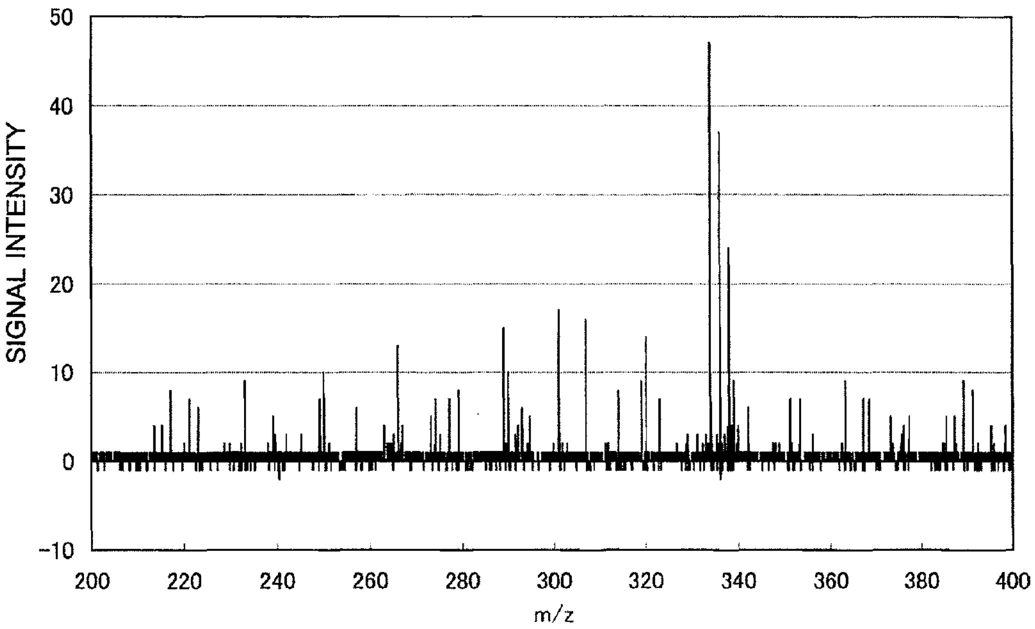
FIG. 2 is an example of the mass spectrum.
Figure 3:
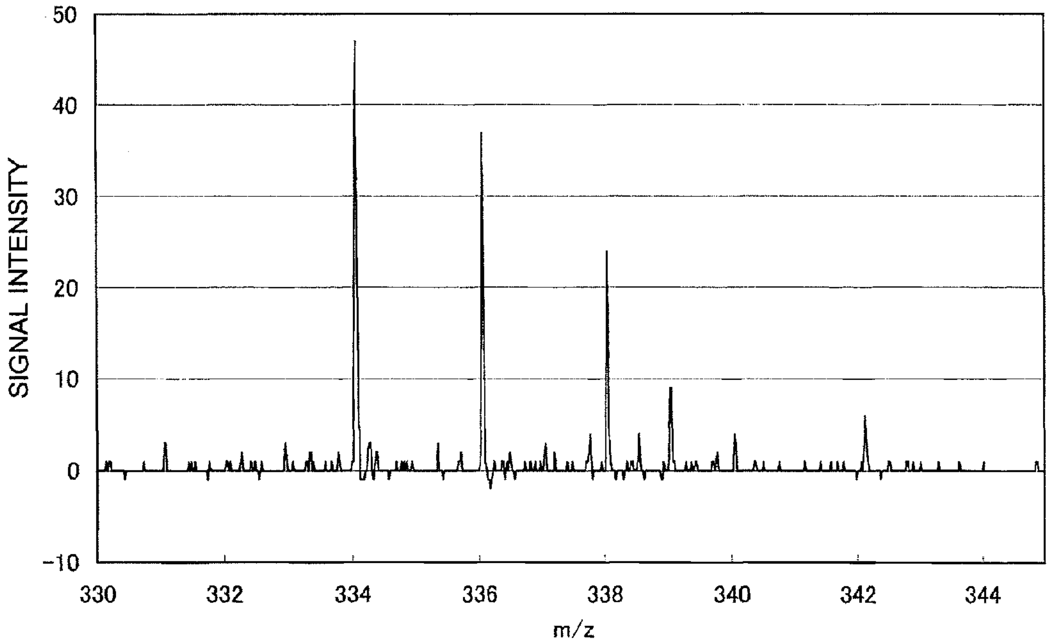
FIG. 3 is a partial mass spectrum corresponding to the m/z range from 330 to 345 of the mass spectrum shown in FIG. 2.
Figure 4:
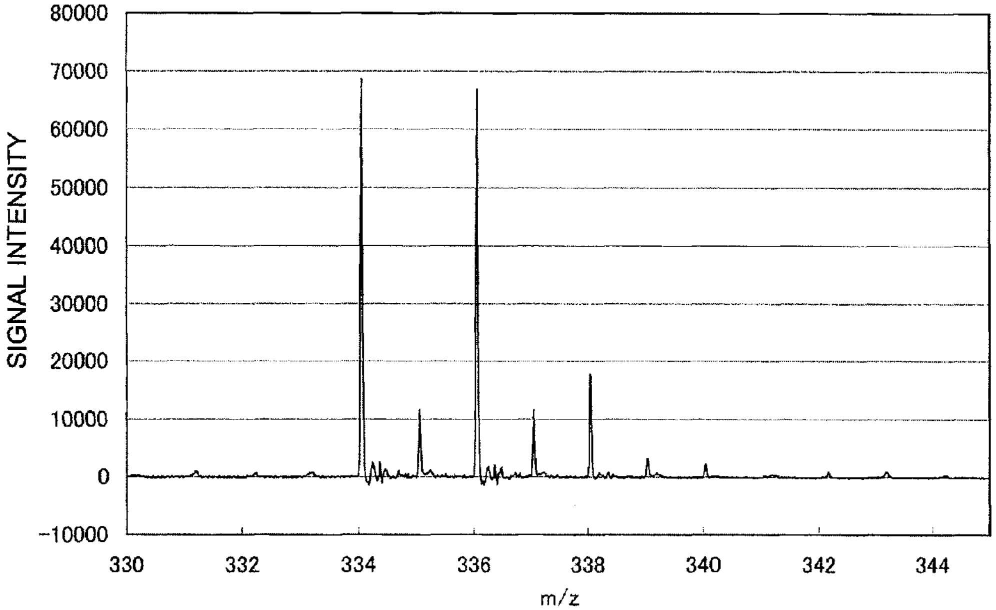
FIG. 4 is an integral spectrum obtained by integrating one thousand pieces of mass spectrums similar to the one shown in FIG. 3.
Figure 5:
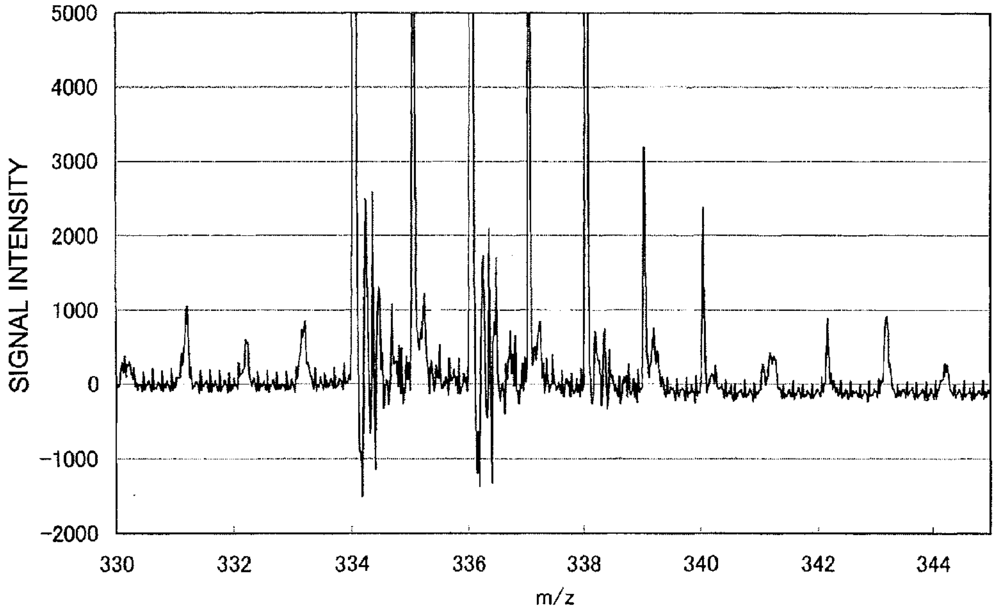
FIG. 5 is a portion of the mass spectrum in FIG. 4 in a vertically stretched form.
Figure 6:
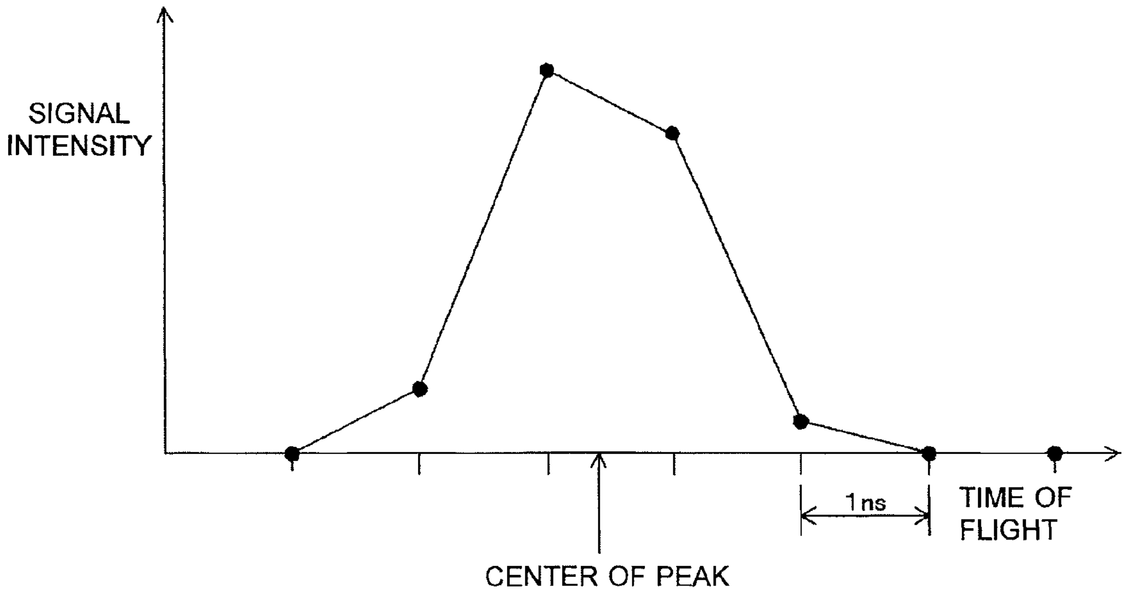
FIG. 6 is an example of data in the vicinity of an ion peak measured with an ADC operating at a clock frequency of 1 GHz.

The data shown in FIG. 2 is one of its examples. The number of data points included in an m/z range from 200 to 400 is 10526. Since each data value consists of 2 bytes, the amount of data forming one mass spectrum is 21052 bytes. These data are divided into the low-order 8 bits and high-order 8 bits. By applying static Huffman coding to the low-order 8 bits of the time-series digital signal including the baseline information, the data will be compressed to 1707 bytes inclusive of 3 bytes for the data length, 1 byte for the bit length and 30 bytes for the Huffman tree and the data value. The average bit length is 1.3 bits. Although this is not comparable to the theoretical limit of the average information amount, i.e. 0.89, the result is remarkable since compressing 8 bits to 1.3 bits means reducing the data amount to 16%.

In the data shown in FIG. 2, since the maximum value is 50 (with the offset value 3 added thereto), the high-order 8 bits are all '0.' Combining the zero length encoding with the static Huffman coding compresses these bits to 8 bytes including 3 bytes for the data length, 1 byte for the bit length and 4 bytes for the Huffman tree, original data values and coding data. Similarly, combining the switched run-length encoding with the static Huffman coding compresses them to 15 bytes including 3 bytes for the data length, 1 byte for the bit length and 11 bytes for the Huffman tree, original data values and coding data. Thus, as compared to the time-series data consisting of the bit strings including the baseline information, the time-series data consisting of the bit strings not including the baseline information can be compressed to an extremely small amount of data.

Figure 8:
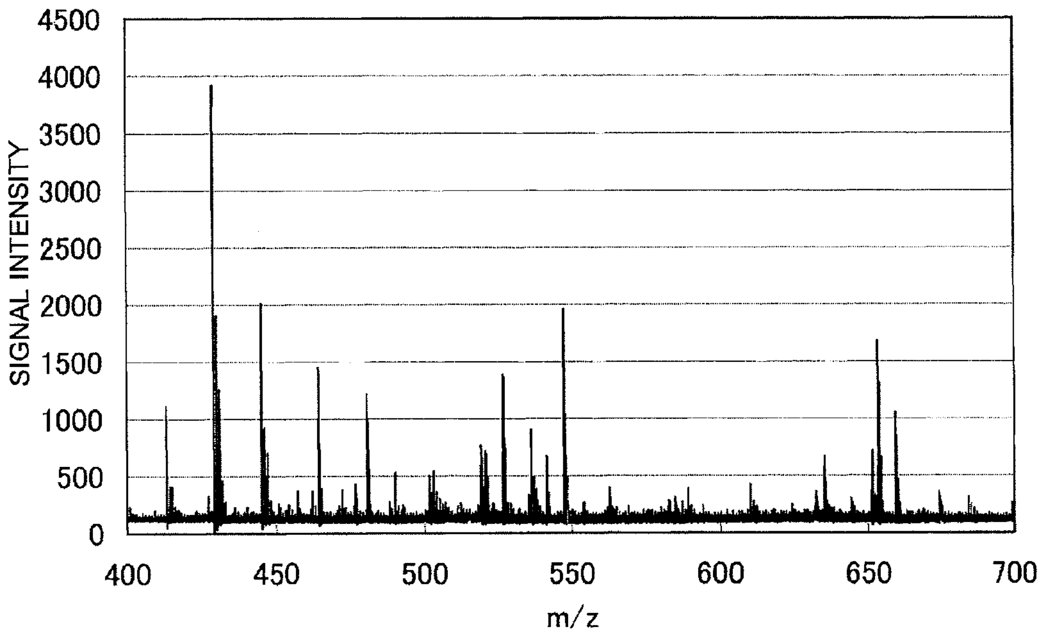
FIG. 8 is an example of the mass spectrum with a plurality of mass peaks whose changing bits are located in high-order 8 bits.

The mass spectrum shown in FIG. 8 is one example of the mass spectrums having a plurality of mass peaks whose changing bits are included in the high-order 8 bits (i.e. whose intensity is equal to or greater than 256). The number of data points is 13790, which corresponds to 27580 bytes in data amount. Compressing their low-order 8 bits results in a data amount of 11603 bytes, or 84% of the original size, including the header, Huffman tree and other necessary information.

As for the high-order 8 bits, using only the static Huffman coding results in a compressed data size of 1801 bytes. Combining the zero length encoding with the static Huffman coding compresses those bits to 245 bytes, and combining the switched run-length encoding with the static Huffman coding yields 374 bytes. Though surpassed by the zero length encoding in terms of the compression ratio, the switched run-length encoding can also achieve a sufficient level of compression efficiency.

Adding the compressed data of the low-order 8 bits and that of the high-order 8 bits comes to a total size of 11848 bytes for the entire mass spectrum after the compression; this is 43% of the original size. The average information (entropy) of the mass spectrum data in FIG. 8 is 6.588 bits, and its theoretical compression limit is 11356 bytes. This result confirms that the method according to the present invention can compress even this type of data to a size approximate to the compression limit, thus achieving an adequately high level of compression efficiency.

In the example of FIG. 8, it was demonstrated that high compression efficiency can be achieved by splitting each data value into its high-order 8 bits and low-order 8 bits so that the high-order 8 bits form a bit string not including the baseline information and the low-order 8 bits form a bit string including the baseline information. For comparison, let us consider another case where each value of the mass spectrum shown in FIG. 8 is split into a bit string created from the odd-number place bits and a bit string created from the even-number place bits. If these two kinds of bit strings, both including the baseline information, undergo the static Huffman coding, the bit strings created from the odd-number place bits will be compressed to 6168 bytes and the bit strings created from the even-number place bits to 7037 bytes, making a total of 13205 bytes. This result demonstrates that this compression method is less efficient than the previous method that splits each data value into a bit string including the baseline information and a bit string not including the baseline information.

As is evident from the previously described results, the present embodiment of the time-of-flight mass spectrometer provides a method for compressing data at high speeds by means of a hardware device after an ion detection signal is recorded as a time-series digital signal and before the data is transferred from an ion signal recorder to a data processor, such as a computer.

This method reduces the processing load on the data processor in displaying information or storing data, while allowing the ion signal recorder to operate at a higher sampling frequency to improve the analysis performance of the time-of-flight measuring device.

The previous embodiment is a mere example of the invention. It is evident that any change or modification appropriately made within the scope of the present invention falls within the scope of the invention.

Industrial Applicability

The present invention can be used as a signal recorder for sampling and recording signals at a high frequency and transferring the obtained data to a computer or similar data processor. For example, it can be used as an ion signal recorder in a time-of-flight mass spectrometer.

The invention claimed is:

1. A time-of-flight measuring device having a signal recorder, which is characterized in that the signal recorder records a detection signal as a time-series digital signal, the digital signal is converted into a plurality of time-series digital signals by being divided into a bit string including baseline information and one or more bit strings not including the baseline information, the aforementioned one or more bit strings not including the baseline information undergo run-length encoding, and subsequently static Huffman coding is performed on each of the plurality of time-series digital signals resulting from a division.

2. The time-of-flight measuring device according to claim 1, which is characterized in that the aforementioned run-length encoding is zero length encoding (ZRE) or switched run-length encoding (SRLE).

3. The time-of-flight measuring device according to claim 2, which is characterized in that the signal recorder uses an analogue-to-digital converter (ADC).

4. The time-of-flight measuring device according to claim 1, which is characterized in that the signal recorder uses an analogue-to-digital converter (ADC).

5. A signal-recording method for a time-of-flight measuring device having a signal recorder, which is characterized in that the signal recorder records a detection signal as a time-series digital signal, the digital signal is converted into a plurality of time-series digital signals by being divided into a bit string including baseline information and one or more bit strings not including the baseline information, the aforementioned one or more bit strings not including the baseline information undergo run-length encoding, and subsequently static Huffman coding is performed on each of the plurality of time-series digital signals resulting from a division.

6. The signal-recording method for a time-of-flight measuring device according to claim 5, which is characterized in that the aforementioned run-length encoding is zero length encoding (ZRE) or switched run-length encoding (SRLE).

7. A time-of-flight mass spectrometer, which is characterized by comprising:

an ion generator;

an ion detector for generating an ion detection signal by an arrival of an ion released from the ion generator; and an ion signal recorder for recording the ion detection signal as a time-series digital signal, for converting the digital signal into a plurality of time-series digital signals by dividing the digital signal into a bit string including baseline information and one or more bit strings not including the baseline information, for applying run-length encoding to the aforementioned one or more bit strings not including the baseline information, and for subsequently performing static Huffman coding on each of the plurality of time-series digital signals resulting from a division.

8. The time-of-flight mass spectrometer according to claim 7, which is characterized in that the aforementioned run-length encoding is zero length encoding (ZRE) or switched run-length encoding (SRLE).

9. The time-of-flight mass spectrometer according to claim 8, which is characterized in that the ion signal recorder uses an analogue-to-digital converter (ADC).

10. The time-of-flight mass spectrometer according to claim 7, which is characterized in that the ion signal recorder uses an analogue-to-digital converter (ADC).

* * * * *